United States Patent [19]

Lipscomb

[11] 4,196,946

[45] Apr. 8, 1980

[54] TEMPERATURE COMPENSATED MAGNETIC BEARING SYSTEM FOR A WATTHOUR METER

[75] Inventor: George W. Lipscomb, Raleigh, N.C.

[73] Assignee: Westinghouse Electric Corp., Pittsburgh, Pa.

[21] Appl. No.: 909,419

[22] Filed: May 25, 1978

[51] Int. Cl.² ............................................. F16C 39/00
[52] U.S. Cl. ................................... 308/10; 324/137
[58] Field of Search ................... 308/10; 324/137, 155

[56] References Cited

U.S. PATENT DOCUMENTS

| | | | |
|---|---|---|---|
| 2,254,698 | 9/1941 | Hansen | 324/155 |
| 3,107,948 | 10/1963 | Lovegrove | 308/10 |
| 3,143,704 | 8/1964 | Wright | 308/10 |
| 3,693,086 | 9/1972 | Redecker | 324/155 |
| 3,807,813 | 4/1974 | Milligan | 308/10 |
| 3,810,683 | 5/1974 | Keever | 308/10 |

*Primary Examiner*—R. Skudy
*Attorney, Agent, or Firm*—R. W. Smith

[57] ABSTRACT

A repulsion-type permanent magnet bearing system for watthour meters includes identical upper and lower permanent magnet assemblies. Each assembly includes a hollow cylindrical magnet including a temperature compensating sleeve extending through each magnet center opening. Soft magnetic shielding cups are attached to the rotor and stator parts of the meter to carry the permanent magnet assemblies in facing relationships. The permanent magnet size and orientation with respect to each other and the cups provides an optimumly maintained bearing gap spacing.

5 Claims, 4 Drawing Figures

4,196,946

TEMPERATURE COMPENSATED MAGNETIC BEARING SYSTEM FOR A WATTHOUR METER

BACKGROUND OF THE INVENTION

The field of this invention relates to temperature compensated magnetic bearing systems and more particularly to such bearing systems for supporting vertical rotors of induction-type watthour meters.

Magnetic bearing systems are well-known for vertically supporting the rotor of an induction meter of the type including watthour meters. The rotor is rotatably supported along a vertical axis by the bearing system so as to maintain a predetermined gap spacing between two magnet assemblies so that a clearance is maintained between a disc carried by the rotor and an electromagnetic portion of the meter stator. These bearing systems include stationary and suspended permanent magnets oriented to produce interacting repulsion or attraction magnetic forces to maintain the meter rotor at the desired vertical position. Consistent with the rugged and compact design of watthour meters and their extended continuous use in varying temperature and ambient conditions, the magnetic bearing systems must be compact, easily manufactured and assembled in mass production, and further must be highly accurate, reliable and maintenance free. One substantially universal consideration of the magnetic bearings is temperature compensation. Most permanent magnet bearing materials are substantially temperature sensitive and the magnetic strengths change inversely with changes in temperature. A reference intermediate bearing gap spacing is typically established at a room temperature of approximately twenty-four degrees C. The size of the permanent magnets, the associated pole face areas and the strength of the permanent magnets' fluxes are critically determined to support the rotor through the reference gap. A portion of the total permanent magnet fluxes is diverted from the gap at the room temperatures and at higher temperatures less flux is diverted so that the magnet sizes, pole face areas and magnet strengths must be proportionally greater than that which be required for rotor support at a constant ambient room temperature.

It has also been observed that increasing the diameter of the magnet pole faces to increase the gap spacing or to provide for further temperature compensation also increases the susceptibility of the bearing system to unbalanced magnetic flux distributions tending to cause greater radial magnetic forces and an undesired side thrust on the rotor shaft. The bearing systems normally require that the bearing support fluxes be symmetrical about the axis of rotation of the rotor being suspended. It has also been observed that in bearing systems having a critical minimum gap spacing that not only are the permanent magnet dimensions and temperature compensating designs critical but also the characteristics of the permanent magnet material must be constant and uniform so that each bearing system is substantially identical for use in supporting rotors of identical meters. It has been found that sometimes the characteristics of the permanent magnet materials can vary due to variations in the constituent materials and the manufacturing processes used to make the permanent magnet materials. Thus, the materials do not always have strictly constant magnetic characteristics to provide bearing magnets which have the maximum flux producing properties desired.

The present invention is most closely related to the repulsion type of permanent magnet bearing systems disclosed in U.S. Pat. Nos. 3,143,704 issued Aug. 4, 1964 to D. F. Wright; 3,309,152 issued Mar. 14, 1967 to Ramsey et al; and 3,810,683 issued May 14, 1947 to J. M. Keever et al, all assigned to the assignee of this invention and incorporated herein by reference. The bearing systems described and claimed in the aforementioned patents include upper and lower permanent magnet assemblies having hollow or ring-shaped permanent magnets carried within soft magnetic cups in facing relationship so as to form the repulsion or floating type of system. The magnetic cups form series flux return paths for the pole face fluxes and are circularly disposed outward of the permanent magnets. The lips of the cups define magnetic poles which are opposite from that of the adjacent magnet pole faces and materially increase the magnetic flux available to lift the meter rotor. The magnetic cups are also effective to substantially decrease leakage fluxes and to produce a more uniform flux pattern at the pole faces. The Keever et al patent discloses a modified form of the bearing system including a temperature compensating sleeve disposed in the center of the lower permanent magnet assembly. The last-named patent extends the temperature range for operation of the bearing system which has a minimum critical gap spacing in the order of 0.018 inch (0.046 cm.). The bearing systems described in the aforementioned patents are highly successful, however, if substantial deviations occur in the characteristics of the permanent magnet materials the permanent magnets do not have a sufficiently strong support producing interaction for extended time periods. In extreme temperature conditions changes in gap spacing may become too great for the minimum critical gap spacing required in the aforementioned highly efficient and compact design.

Other prior art patent disclosing face-to-face or repulsion-type permanent magnet bearing systems are U.S. Pat. Nos. 2,254,698; 2,315,408; 3,107,948; 3,326,610; 3,370,896; and 3,657,676. The aforementioned patents do not include a magnetic bearing system having facing permanent magnets carried in soft magnetic cup members and further including temperature compensating elements in both the upper and lower permanent magnet systems as included in the present invention. The U.S. Pat. Nos. 3,325,757 and 3,325,758 both disclose temperature compensated magnetic structures having upper and lower facing permanent magnets each including a temperature compensating sleeve around the outer diameters rather than the inner diameters. The last two named patents are intended for producing a constant magnetic flux in the space between the magnets and are both stationary so as to not provide a magnetic bearing system.

SUMMARY OF THE INVENTION

In accordance with the present invention, a temperature compensated magnetic bearing system for an induction watthour meter includes identical upper and lower permanent magnet assemblies. Each assembly includes a hollow cylindrical permanent magnet supported in a soft magnetic cup. The open ends of the cups are in facing coaxial alignment so that the annular pole faces of the magnets define a bearing support gap. A temperature compensating sleeve is positioned within the inner diameter of each of the permanent magnets and extends between the opposite pole face ends. A temperature responsive shunt magnetic path is formed through each sleeve and between the magnet ends. The temperature compensating sleeve includes a material having a negative temperature coefficient of permeability which is an opposite characteristic from the magnetic temperature characteristic of the permanent magnets. The annular pole faces produce interacting magnetic fluxes to support the upper permanent magnet assembly at minimally variable predetermined gap spacings with changes in temperature. The opposing pole faces of the magnets are radially spaced from the annular end or lip of the cup at a substantially magnetically isolated radial distance. The primary flux return path of each permanent magnet is formed in the cylindrical space outside the permanent magnets and not substantially including the soft magnet cups.

It is a general feature of this invention to provide a magnetic bearing system having identical and symmetrically oriented upper and lower permanent magnet assemblies each including a hollow permanent magnet having a temperature compensating sleeve extending through the center thereof and carried in facing shielding soft magnetic cups. It is a further feature of this invention to provide a system with the permanent magnets made of a barium ferrite permanent magnet material for producing an extended bearing support gap spacing so that a wider selection of barium ferrite permanent magnets may be made to accommodate variations in the permanent magnet strengths and variations in the dimensions of the permanent magnets. And it is a still further feature of this invention to provide the magnetic bearing system with decreased variations in the bearing support gap with temperature changes by the use of two temperature compensating sleeves uniquely forming a cylindrical temperature responsive flux return path extending around the inner diameters and between the permanent magnetic annular pole faces.

These and other features and advantages of the present invention will become apparent with the description of the preferred embodiment as shown in the drawings briefly described hereinafter.

DESCRIPTION OF THE PREFERRED EMBODIMENT

Figure 1:
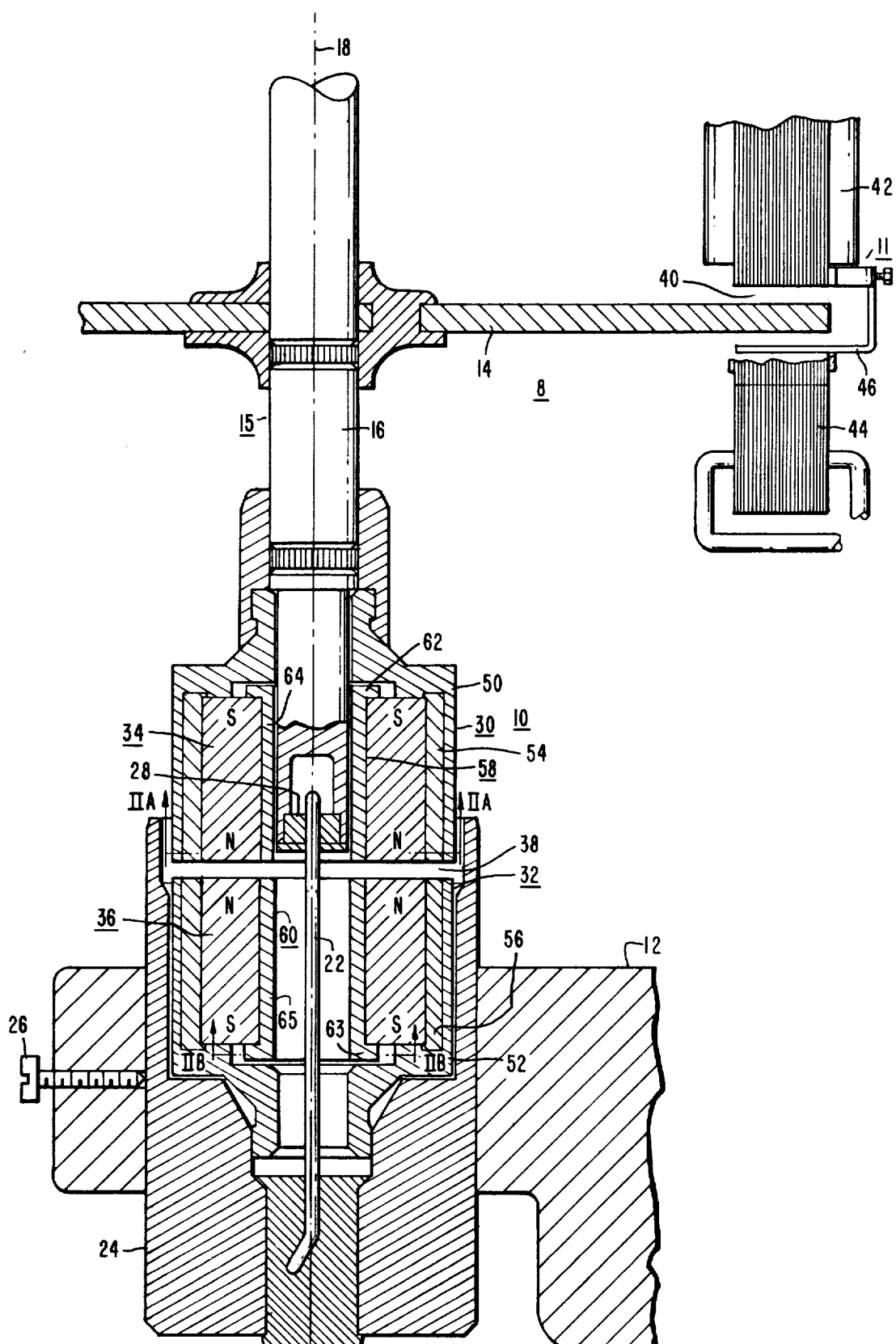
FIG. 1 is a side elevational view in section of a portion of an induction watthour meter having a magnetic bearing system made in accordance with the present invention.

Referring now to the drawing, and more particularly to FIG. 1, there is shown a portion of an alternating current watthour meter 8 which may be as shown in the above-identified U.S. Pat. No. 3,309,152, except that the bearing system described therein is replaced with a magnetic bearing system 10 made in accordance with the present invention. The watthour meter 8 includes a stator having an electromagnet assembly 11 and a frame 12 partially shown in FIG. 1. The frame 12 supports the bearing assembly 10 and further supports the electromagnet assembly 11 which directs alternating magnetic fluxes into an electroconductive disc 14 so that it is rotated at a rate proportional to the consumption of electrical energy to be measured by the meter 8.

A rotor 15 of the meter 8 includes the meter disc 14 which is carried on a vertical shaft 16 mounted for rotation about a vertical axis 18. The shaft 16 is secured at an upper end, not shown, as described in the aforementioned U.S. Pat. No. 3,309,152 and at the lower end by the magnetic bearing system 10. The weight of the meter rotor 15, including the shaft 16 and the disc 14, is axially supported by the magnetic bearing system 10. The system 10 is made symmetrical about the vertical axis of rotation 18. A vertical pin 22 is secured to a sleeve 24, which is preferably made of a non-magnetic material such as aluminum, to restrain radial movement of the rotor 15. The sleeve 24 is clamped in a lower cylindrical opening of the frame 12 by a screw 26. The end of the shaft 16 includes a ring bearing 28, described and claimed in U.S. Pat. No. 3,693,086, and assigned to the assignee of this invention. The ring bearing 28 slidably receives the pin 22 and a similar ring bearing is provided for mounting the top of the shaft 16 so that the two ring bearings prevent lateral movement of the ends of the rotor shaft as the shaft and disc 14 rotate.

The weight of the disc 14 and shaft 16, being in the order of twenty-two grams, is supported by the interacting magnetic fluxes of two identical permanent magnet assemblies 30 and 32 with the upper assembly 30 carrying a permanent magnet 34 and the lower assembly carrying a permanent magnet 36. The permanent magnets 34 and 36, described in more detail hereinbelow are magnetized axially in such polarities as to present like annular poles facing each other. According the annular pole face ends of the permanent magnets 34 and 36 are indicated as being magnetized, for purposes of this description, to provide a north pole at the magnet ends including the facing pole faces and south poles at the opposite or outer ends of the permanent magnets. A magnetic repulsion force is developed by the interaction of the magnetic pole face fluxes to suspend or float the upper assembly above the lower assembly 32 through an axial space between the assemblies defining the bearing support gap 38.

Before describing the magnetic bearing assembly 10 in further detail, it is to be noted that the assembly 10 is adjustably mounted within the frame 12 and clamped in place by the screw 26 so that the disc 14 is disposed within a disc air gap space 40 of the electromagnetic assembly 11. As described in the aforementioned U.S. Pat. No. 3,309,152 and also as described in U.S. Pat. No. 3,493,862 issued Feb. 3, 1970 to Ramsey, Jr. et al and assigned to the assignee of this invention, the electromagnetic assembly 11 includes a voltage section 42 and a current section 44 disposed on opposite sides of the air gap 40. A soft magnetic flux return tongue member 46 is associated with the voltage section 42 and defines the lower limit of the disc air gap 40 below the disc 14. As well understood by those skilled in the art of watthour meters, the voltage and current sections 42 and 44 direct magnetic fluxes into the electroconductive disc 14 so that it is rotated in the gap 40 at a rate proportional to the consumption of electrical energy being measured. Accordingly, the bearing assembly 10 must support the disc 14 so that it has clearance between the bottom of the voltage section 42 and the top of the tongue member 46 with the gap being in the order of 0.09 inch (0.23 cm.) in one form of the electromagnetic assembly 11.

Referring now further to the assembly 10, the permanent magnets 34 and 36 are preferably constructed of a permanent magnet material having a high coercive force. These materials include ceramic or ferrite permanent magnet materials such as those having a chemical formula of $MO_6Fe_2O_3$ where M represents the material such as barium, lead or strontium. Fe represents iron and O represents oxygen. In a preferred embodiment of the invention, the barium containing material is employed and is represented by the chemical formula $BaO_6Fe_2O_3$. Such permanent magnet material having a coercive force in the order of 1700 oersteds has been employed in a preferred embodiment of this invention. With the magnets 34 and 36 being made of the aforementioned barium ferrite permanent magnet material and with the magnets and the remaining portions of the assemblies 30 and 32 being formed as described further hereinbelow, the bearing support gap spacing has a length in the order of 0.038 to 0.042 inch (0.096 to 0.11 cm.) to properly maintain a disc 14 in the gap 40.

When the permanent magnets 34 and 36 are made of the aforementioned barium ferrite material and are formed substantially identical in a ring or hollow cylindrical configuration, the magnet dimensions in one preferred embodiment are as follows: an outer diameter of approximately 0.345 inch (0.88 cm.), an inner diameter of 0.165 inch (0.42 cm.) and a length of 0.25 inch (0.62 cm.).

The permanent magnets 34 and 36 are mounted in soft magnetic shielding cups 50 and 52. The cups have a cylindrical wall with an inner diameter of approximately 0.404 (1.02 cm.), an outer diameter of 0.434 inch (1.10 cm.) and a depth between the open end of the cup and the bottom of the area receiving the permanent magnet of approximately 0.252 inch (0.625 cm.). Extending from the bottom of the cups is a hub portion for either mounting on the end of the shaft 16 or positioning in the bottom of the sleeve 24 as shown in FIG. 1. The cups 50 and 52 are identical and are made of a low carbon steel or cold roll soft magnetic steel.

Figure 2A:
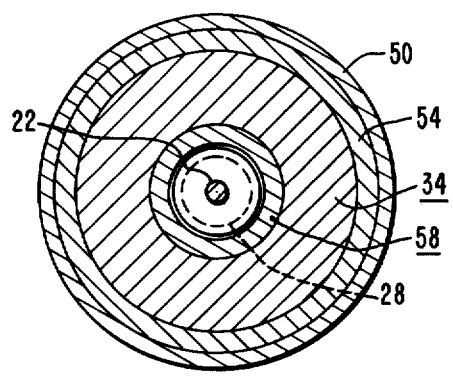
FIGS. 2A and 2B are cross-sectional views of FIG. 1 taken along the axes IIA and IIB respectively, and looking in the direction of the arrows.

The permanent magnets 34 and 36 are formed before assembling to the cups with a die cast ring having axial ridges which have an interference fit with the inner diameters of the cups. The permanent magnets 34 and 36 are force-fitted into the cups so that the tin-lead alloy of the cast material form the hollow cylindrical material 54 and 56. The end sectional view of FIG. 2A illustrates the radial relationships of the assembly 30. The width of the solder-like securing materials 54 and 56 between the inner diameter of the cups 50 and 52 and the outer diameters of the permanent magnets 34 and 36 is in the order of 0.03 inch (0.076 cm.) to space the sides of the cups and the permanent magnets at a substantially magnetically isolated radial distance apart to provide operation as described further hereinbelow. It is to be noted that the mounting of the permanent magnets in the cups is after the permanent magnets have been provided with temperature compensating sleeves 58 and 60 described hereinafter.

The temperature compensating sleeves 58 and 60 are included in the upper and lower permanent magnet assemblies 30 and 32, respectively, forming an important feature of the present invention. The compensating sleeves minimize the axial disc movement in the disc air gap 40 over extended and elevated temperature ranges which cause changes in the magnetic strengths of the permanent magnets 34 and 36. Typically, the permanent magnet material forming the permanent magnets causes a decrease in magnetic flux from the pole faces thereof to decrease the bearing support affect of the fluxes which is a well-known consideration in bearing systems such as the system 10. The temperature compensating sleeves 58 and 60 are made of a magnetic material having a negative temperature coefficient of permeability such as provided by a nickel-steel alloy having about 31% nickel content. The temperature compensating sleeves are coaxially aligned and extend between the opposite ends of the permanent magnets along the inner diameters thereof.

Figure 2B:
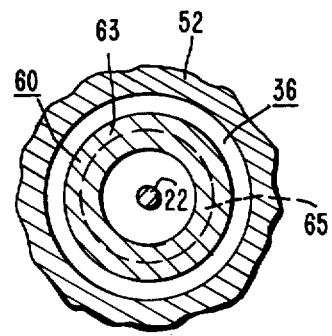

The overall length of each of the compensating sleeves is 0.270 inch (0.69 cm.) having flanges 62 and 63 at the outer ends thereof fitting against the outer ends of the permanent magnets and formed with a diameter of 0.204 inch (0.518 cm.) cylindrical bodies 64 and 65 extending therefrom having an outer diameter of 0.157 inch (0.399 cm.) and a wall thickness in the order of 0.018 inch (0.046 cm.). The outer or bottom end of magnet 36 and compensating sleeve 60 is shown in the end sectional view of FIG. 2B.

As shown in FIG. 1 the temperature compensating sleeves 58 and 60 have the circular flange portions 62 and 63 thereof seated against the outer ends of the permanent magnets 34 and 36 and the thin cylindrical body portions 64 and 65 thereof extends through the inner diameter to terminate flush with the pole faces of the permanent magnets. As noted hereinabove the permanent magnets are assembled in the cups 50 and 52 after they have the die cast solder ring material 54 and 56 and with the temperature compensating sleeves 58 and 60 mounted in the bottoms of the cups oriented in an open end up position so that the inner diameter of the magnets slip over the compensating sleeves as the ring materials 54 and 56 are pressed into the cups.

The permanent magnet assemblies 30 and 32 formed as described hereinabove produce the suspension of the assembly 30 above the assembly 32 due to the interacting pole face fluxes. The compensating sleeves 58 and 60 form shunt flux return paths which are effective to conduct higher amounts of flux from the pole face fluxes at lower temperatures when the magnetic fields of the permanent magnets are the strongest. Flux return paths are also formed around the outer diameters of the permanent magnets which are essentially air flux return paths including the cylindrical rings of the solder materials 54 and 56. The spacing of the outer diameters of the permanent magnets from the inner diameters of the soft magnetic cups is such that negligible or very slight permanent magnet fluxes are returned therethrough. The absence of any substantial effect on the fluxes by the cups 50 and 52 has been established by measuring the support gap with and without the cups 50 and 52 and it has been found that there is negligible difference so that they do not appear to have an additional magnetic lifting effect. The cups do have an important shielding effect because it has been found that fluxes from the electromagnetic assembly 11 and from a damping magnet, not shown, but described in the aforementioned patents hereinabove, produce undesired effects on the permanent magnets 34 and 36 when the shielding effect of the cups is not provided. Without the shielding effect of the cups 50 and 52, a higher starting watts and drooping registration curve at low loads indicate an effect of the magnetic field external to the bearing system 10 producing an effect similar to that of higher rotational friction at the bearing system 10. Accordingly, it is advantageous that the cups provide a mounting of permanent magnets as well as shield for protecting the assembly from the meter magnetic fields.

Figure 3:
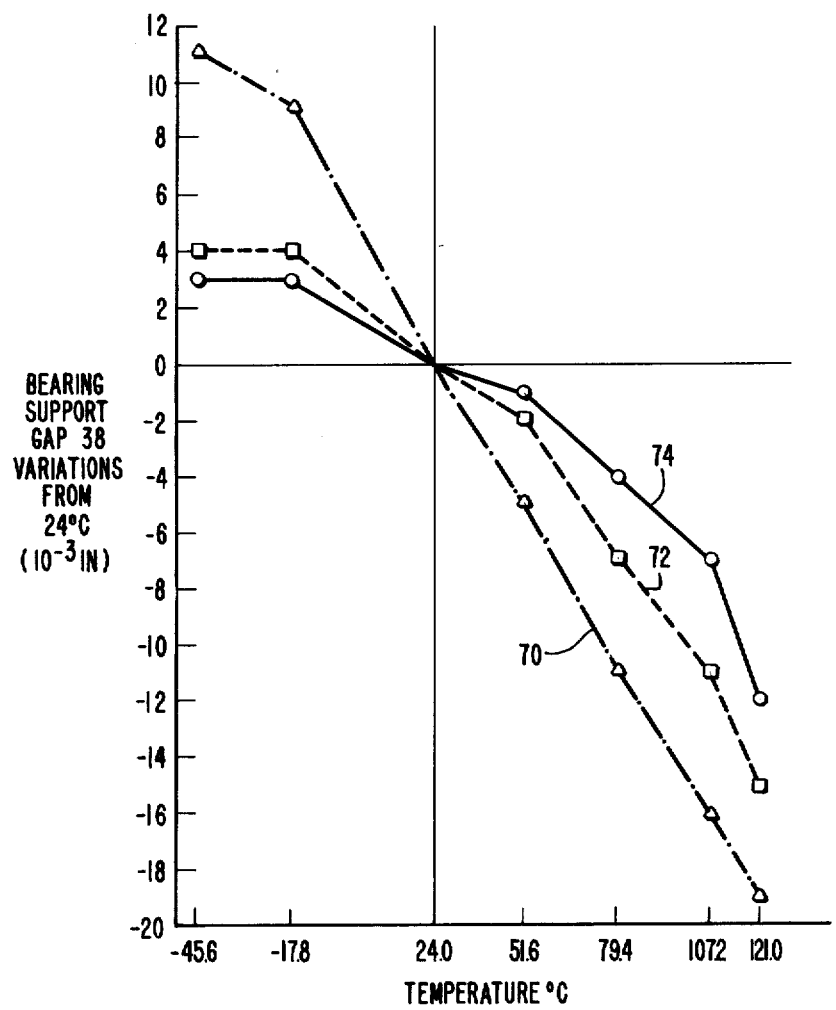
FIG. 3 is a graph of curves illustrating the relative changes in the bearing support gap spacing of the system shown in FIG. 1 with temperature variations when neither, one or both of two temperature compensating sleeves are used in the system illustrated in FIG. 1.

With the bearing support gap 38 being established at a reference spacing in the range of 0.038 to 0.044 inch at a room temperature of 24° C. the graph of FIG. 3 shows the changes in the distances of the bearing gap spacing wherein the curve 70 is for the bearing system 10 without either of the temperature compensating sleeves 58 or 60, the curve 72 is for the system 10 with only the bottom temperature compensating sleeve 60, and the curve 74 is for the system 10 having both compensating sleeves as shown in FIG. 1. The temperature ranges between −46° C. to +121° C. are shown along the bottom of the graph in FIG. 3 and the vertical portion of the graph corresponds to the changes in the bearing gap 38 relative to the gap spacing at room temperature of 24° C. The improvement of using the upper compensating sleeve 58 as well as the lower compensating sleeve 60 as shown in the graph 70 produces a variation in the bearing support gap which is within the tolerance permitted by the associated movement of the disc 14 within the disc gap 40 of the assembly 11.

It has been found that a variation of the characteristics and the barium ferrite permanent magnet materials used in the permanent magnets 34 and 36 and the variation of the dimensions occurring in manufacturing processes of the system 10 may produce slight variations in the spacing of the bearing support gap 38 and also variations in the symmetrical patterns of the pole face fluxes. Desirably, the permanent magnet fluxes should be substantially constant at any given radial distance from the axis 18 around the coaxial diameters of the two permanent magnet assemblies 30 and 32. The design of the bearing system 10 accommodates variations in dimensions and materials and alignment of the parts of the system due to its symmetrical arrangement. The bearing support gap of 0.038 to 0.042 inch (0.096 to 0.107 cm.) as noted hereinabove is established by the system 10 at the room temperature of 24° C. without adverse variation thereof at the extended temperature ranges between −46° C. to 120° C. It is to be noted that extending the diameter of the permanent magnets and thereby extending the pole face areas to produce additional lifting effect of the permanent magnet fluxes is offset by an increased tendency of the magnets to produce adverse side thrust or tilt effects on the shaft 16 due to discontinuities or dissymmetries in the magnet flux distribution at the outer diameters of the pole face fluxes. Although it is known that the cups 50 and 52 may aid in the total lifting effect of the permanent magnet fluxes if they are positioned closer and in a flux return relationship to the outer diameters of the permanent magnets, the additional lifting flux is not required in the system 10 and the symmetrical arrangement of the system 10 reduces the potential side thrust effects due to flux dissymmetry of a larger magnet radius. When the cups 50 and 52 are arranged to aid in the magnetic lift, more tendency to have tilt error has been found in some instances. Therefore, the cups 50 and 52 are only utilized for magnetic shield of the bearing system 10.

While a preferred form of the present invention has been described modifications and changes of the invention may be made without departing from the spirit and scope of my invention.

I claim:

1. An induction watthour meter including a stator, a rotor and a temperature compensated magnetic bearing system for supporting said rotor for rotation about a vertical axis, wherein said bearing system comprises:
    upper and lower magnet mounting members carried by said rotor and said stator, respectively;
    upper and lower substantially identical hollow cylindrical permanent magnets having identical and mutually opposite annular pole face ends and carried by said upper and lower magnet mounting members, respectively, in concentric alignment such that the magnetic fluxes of the opposing pole face ends are mutually interacting to support said rotor by maintaining said upper permanent magnet at a predetermined support gap spacing above said lower permanent magnet, and further such that identical substantially non-magnetic flux return paths extend from radially outward portions of the pole face magnetic fluxes of said permanent magnets and along the outer diameters thereof; and
    upper and lower substantially identical temperature compensating sleeves having identical and mutually opposite cylindrical ends extending from adjacent the opposing pole face ends of said upper and lower permanent magnets, respectively, and along the inner magnet diameters in a cylindrical body terminating at the opposite pole face ends of each of said permanent magnets, said temperature compensating sleeves having a magnetic temperature coefficient characteristic opposite from the magnetic temperature coefficient characteristic of said permanent magnets such that said compensating sleeves define identical shunt flux return paths for radially inward portions of the pole face magnetic fluxes of said permanent magnets with said shunt flux return paths varying inversely with the magnetic characteristics of said permanent magnets to maintain substantially low variations in said support gap spacing with changes in temperature.

2. An induction watthour meter as claimed in claim 1 wherein said upper and lower compensating sleeves each include an annular flange extending radially outward at the outer pole ends of said permanent magnets.

3. An induction watthour meter as claimed in claim 5 wherein said permanent magnets are made of a barium ferrite magnetic material and each of said identical annular pole faces include an outer diameter of approximately 0.34 inch (0.86 cm.) and an inner diameter of approximately 0.165 inch (0.42 cm.) and wherein the outer diameter of each of said permanent magnets is spaced not closer than approximately 0.03 inch (0.076 cm.) from said open ends of each of said cups such that the cups are effective to shield said permanent magnets while being in a substantially magnetically isolated relationship therewith.

4. An induction watthour meter as claimed in claim 3 wherein said permanent magnets each include a cylindrical length of approximately 0.25 inch (0.63 cm.) and a bearing gap support is established in the order of 0.038 inch to 0.042 inch (0.096 cm. to 0.11 cm.) at a room temperature of 24° C., when said rotor has a weight of approximately twenty-two grams.

5. An induction watthour meter as claimed in claim 1 wherein said upper and lower magnet mounting members include substantially identical magnetic shielding cups carried in facing concentric alignment by said rotor and said stator with the open ends of said cups being substantially coplanar with the magnet pole face ends and with said shielding cups being spaced at a substantially nonmagnetically isolated radial distance from the outer diameters of said permanent magnets.

* * * * *